United States Patent [19]

Rose

[11] Patent Number: 5,740,606
[45] Date of Patent: Apr. 21, 1998

[54] METHOD OF MANUFACTURING A SET OF ELECTRONIC MODULES FOR ELECTRONIC MEMORY CARDS

[75] Inventor: Rene Rose, Voisin-le-Bretonneux, France

[73] Assignee: Schlumberger Industries, Montrouge, France

[21] Appl. No.: 743,546

[22] Filed: Nov. 4, 1996

[30] Foreign Application Priority Data

Nov. 3, 1995 [FR] France .................. 95 13120

[51] Int. Cl.$^6$ ............................................ H05K 3/34
[52] U.S. Cl. ................... 29/840; 29/827; 235/488; 235/492; 427/97
[58] Field of Search ............... 29/840, 827; 235/488, 235/492; 427/96, 97

[56] References Cited

U.S. PATENT DOCUMENTS

| | | | |
|---|---|---|---|
| 3,561,110 | 2/1971 | Feulner et al. | 427/97 X |
| 4,118,523 | 10/1978 | Bingham et al. | 427/97 |
| 4,908,940 | 3/1990 | Amano et al. | 29/852 |
| 4,996,411 | 2/1991 | Rabjoek. | |
| 5,134,773 | 8/1992 | LeMaire et al. | 29/827 |
| 5,239,198 | 8/1993 | Lin et al. | |
| 5,365,635 | 11/1994 | Rose | 29/827 |

FOREIGN PATENT DOCUMENTS

| | | |
|---|---|---|
| A-0063843 | 3/1982 | European Pat. Off. |
| A-643366 | 3/1995 | European Pat. Off. |
| 56-156792 | 12/1991 | Japan ............. 427/96 |
| A-04 018399 | 4/1992 | Japan . |
| A-07 025189 | 1/1995 | Japan . |
| A-07 228083 | 8/1995 | Japan . |

*Primary Examiner*—Carl J. Arbes
*Attorney, Agent, or Firm*—Frishauf, Holtz, Goodman, Langer & Chick, P.C.

[57] ABSTRACT

A method of manufacturing a set of electronic modules for memory cards, using flip chips. A plurality of through holes are formed through an insulating sheet substrate to be filled with a conductive material for the purpose of establishing electrical continuity between first and second faces of the substrate. The first face is designed to receive contacts for making an electrical connection with an external connector, and the second face is designed to receive interconnection patterns for connection with a flip chip. The electrical contacts are silkscreened on the first face of the substrate, with the holes then being partially filled with a conductive ink. The interconnection patterns are silkscreened on the second face of the substrate, with the holes then being filled up with the ink. Flip chips are then mounted on the interconnection patterns.

10 Claims, 6 Drawing Sheets

METHOD OF MANUFACTURING A SET OF ELECTRONIC MODULES FOR ELECTRONIC MEMORY CARDS

FIELD OF THE INVENTION

The present invention relates to a method of manufacturing a set of electronic modules for electronic memory cards, using integrated circuits having projections. A particularly advantageous application of the invention lies in the field of manufacturing electronic memory cards in which the integrated circuit or chip may be either an EEPROM or an EPROM memory on its own, as applies to phone cards, or else a memory associated with a microprocessor in the same circuit as applies to bank cards.

BACKGROUND OF THE INVENTION

For several years, presently known methods of manufacturing electronic modules on an industrial scale have been incapable of obtaining further significant reductions in cost price. Technically speaking, these known methods, whether using techniques that implement an insulating substrate with etched contacts (printed circuit) or a conductive substrate (of the metal lead-frame type) adapt poorly to module standardization, thus requiring extensive assembly equipment and/or tooling. In addition, they are incompatible with another technology for assembling and interconnecting integrated circuits having projections, and commonly referred to by the term "flip chip".

Such integrated circuits have projections formed on their input/output metallizations, with the projections being made up of one or more electrically conductive materials. After being mounted on the substrate, the projections provide the functions of electrical connection, mechanical support, and thermal conduction. The advantages of such a technology include the following:

(1) a reduction in the number of assembly operations;

(2) elimination of fragile interconnection wiring;

(3) a single bonding operation per input/output metallization;

(4) improved reliability; and (5) a reduction in three-dimensional size since the contacts, the projections in this case, do not project beyond the perimeter of the integrated circuit and there are no loops of wire above it.

SUMMARY OF THE INVENTION

An object of the present invention is to provide a method of manufacturing a set of electronic modules for electronic memory cards using integrated circuits having projections, which method should make it possible to include the advantages of "flip chip" technology both economically and technically, and should enable modules to be produced in batches of large capacity.

This and other objects are attained in accordance with one aspect of the invention which is directed to a method that comprises the following steps:

a) forming a plurality of groups of regularly spaced apart through holes in an insulating sheet substrate, each group of holes being associated with an electronic module, and said through holes being provided to receive a conductive material in order to provide electrical continuity between first and second faces of the insulating substrate, said faces being respectively provided to receive, for each electronic module, firstly electrical contacts for connection with an external connector, and secondly interconnection patterns onto which the integrated circuit having projections is to be mounted;

b) a first silkscreening operation for making said electrical contacts by depositing a conductive ink on the first face of the insulating sheet substrate, said holes being partially filled with said ink;

c) a second silkscreening operation for making said interconnection patterns by depositing a conductive ink on the second face of the sheet of substrate, said holes being filled up with said ink; and d) mounting integrated circuits having projections on the interconnection patterns on said second face of the insulating substrate.

Thus, for example, on a sheet having a side of 152.4 mm (6 inches), it is possible to obtain about one hundred electronic modules each of which has the usual area dimensions.

It should be observed that the configuration of the electrical contacts silkscreened onto the first face of the insulating substrate is common to various applications, independently of the type of integrated circuit used, whereas the interconnection patterns on the second face of the substrate sheet are specific to a particular type of integrated circuit.

This gives rise to a particularly advantageous possibility whereby said insulating substrate sheet is stored after the first silkscreening step b) and prior to the second silkscreening step c). The first silkscreening operation can then be performed on a large scale, and after the conductive ink has dried and has been baked, sheets of insulating substrate silkscreened in this way can be stored ready, when required, to receive interconnection patterns that are specific to the integrated circuits to be mounted on the electronic modules.

A known technique of making electronic memory cards includes placing the modules in a mold whose cavities define ISO standard cards and then injecting a thermoplastic material. The thermoplastic material may be an ABS, a polycarbonate, or a material from the polyethylene family. Under such circumstances, the insulating substrate sheet is selected so as to create molecular bonds during injection between said substrate and the injected thermoplastic material.

Another known technique for making cards is that of assembling modules in card bodies provided for that purpose with respective module-receiving cavities formed by molding or by machining. To this end, the present invention provides an intermediate step between the second silkscreening step c) and the assembly step d) in which a material for assembling electronic modules in electronic memory card bodies is deposited around said interconnection patterns. Deposition may be performed by silkscreening, by depositing adhesive, or by any other method.

In variants of the invention, said assembly material is a thermally reactivatable epoxy resin, a hot melt adhesive, or a thermoplastic for bonding by ultrasound. When using ultrasound, the dimensions of the pattern must be such as to enable ultrasound energy to be concentrated sufficiently.

DETAILED DESCRIPTION OF THE INVENTION

Figure 1:
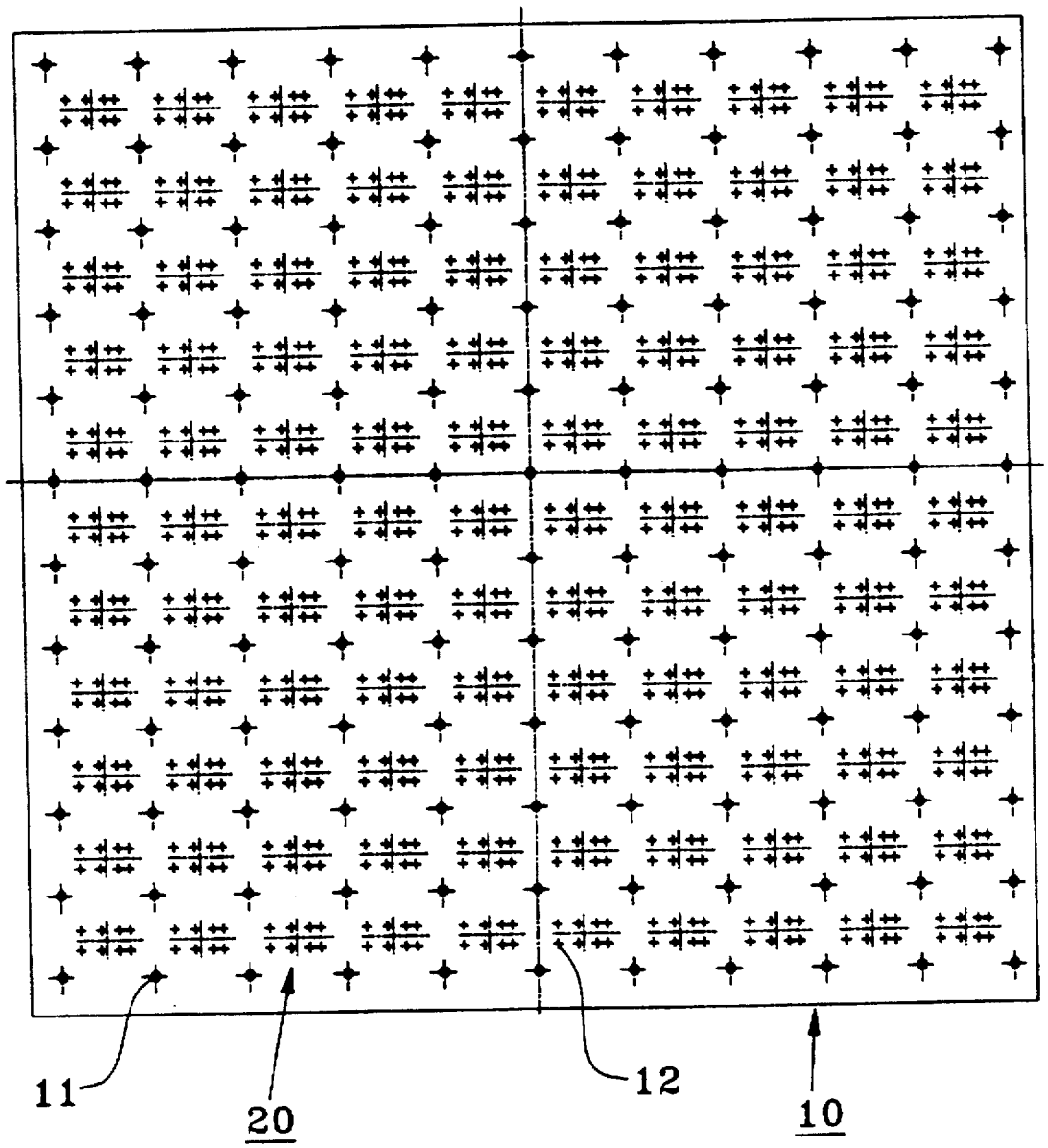
FIG. 1 is a plan view of an insulating substrate sheet perforated by through holes.

FIG. 1 is a plan view of a sheet 10 of insulating material designed to serve as a substrate for a set of electronic modules comprising integrated circuits having projections ("flip chips"). Naturally, the insulating material constituting the substrate sheet 10 must be compatible with the temperature at which the inks used for silkscreening are baked and with the type of flip chips used for fitting the electronic modules, and also the way in which the card is made. In non-limiting manner, the following materials can be suitable for making the insulating substrate sheet 10: epoxy-impregnated glass cloth; polycarbonate; polyester; polyimide; polyacrylate; polyetherimide.

Since the method of the invention is particularly intended for simultaneously manufacturing a large number of electronic modules, the surface area of the substrate sheet 10 should be as large as possible, while nevertheless remaining compatible with the accuracy required of the patterns to be printed, e.g. of side 152.4 mm for one-hundred modules. The thickness of the sheet 10 lies in the range 0.1 mm to 0.2 mm.

As shown in FIG. 1, the insulating substrate is pierced by holes passing through the thickness of the sheet 10. This machining is performed by a programmable machine, in a conventional, well known way, preferably on a stack of sheets clamped between two plates of metal.

Two series of holes are machined. Firstly, large-diameter holes 11 having the function of serving for centering and indexing purposes. Secondly, holes 12 of smaller diameter that are organized in regularly spaced apart groups 20, with each group 20 being associated with one electronic module. As the method proceeds, the holes 12 are filled with conductive material so as to provide electrical continuity between a first face (FIG. 2) and a second face (FIG. 4) of the insulating substrate.

Figure 2:
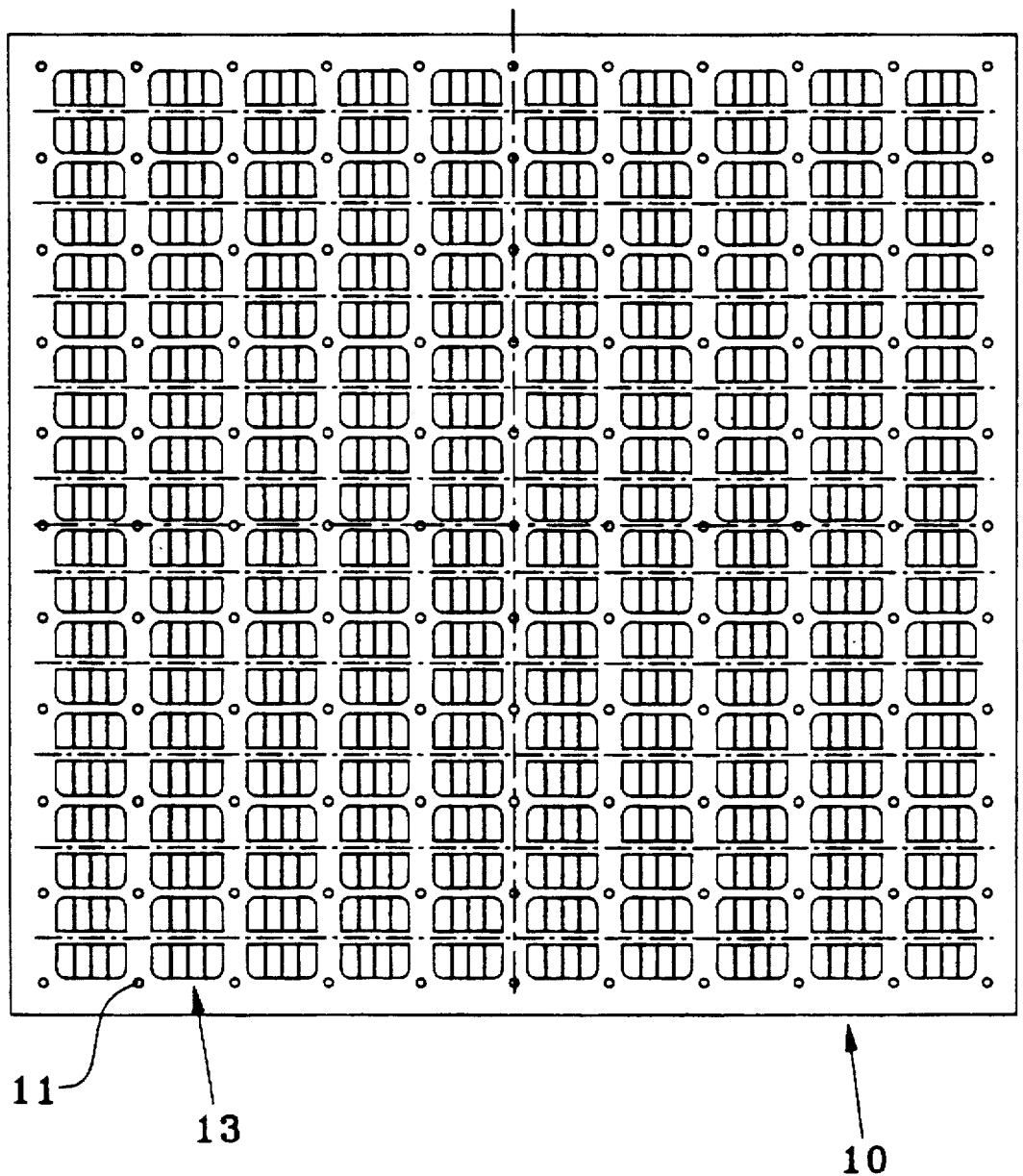
FIG. 2 is a plan view of the first face of the sheet shown in FIG. 1, after the electrical contacts have been silkscreened.
Figure 3:
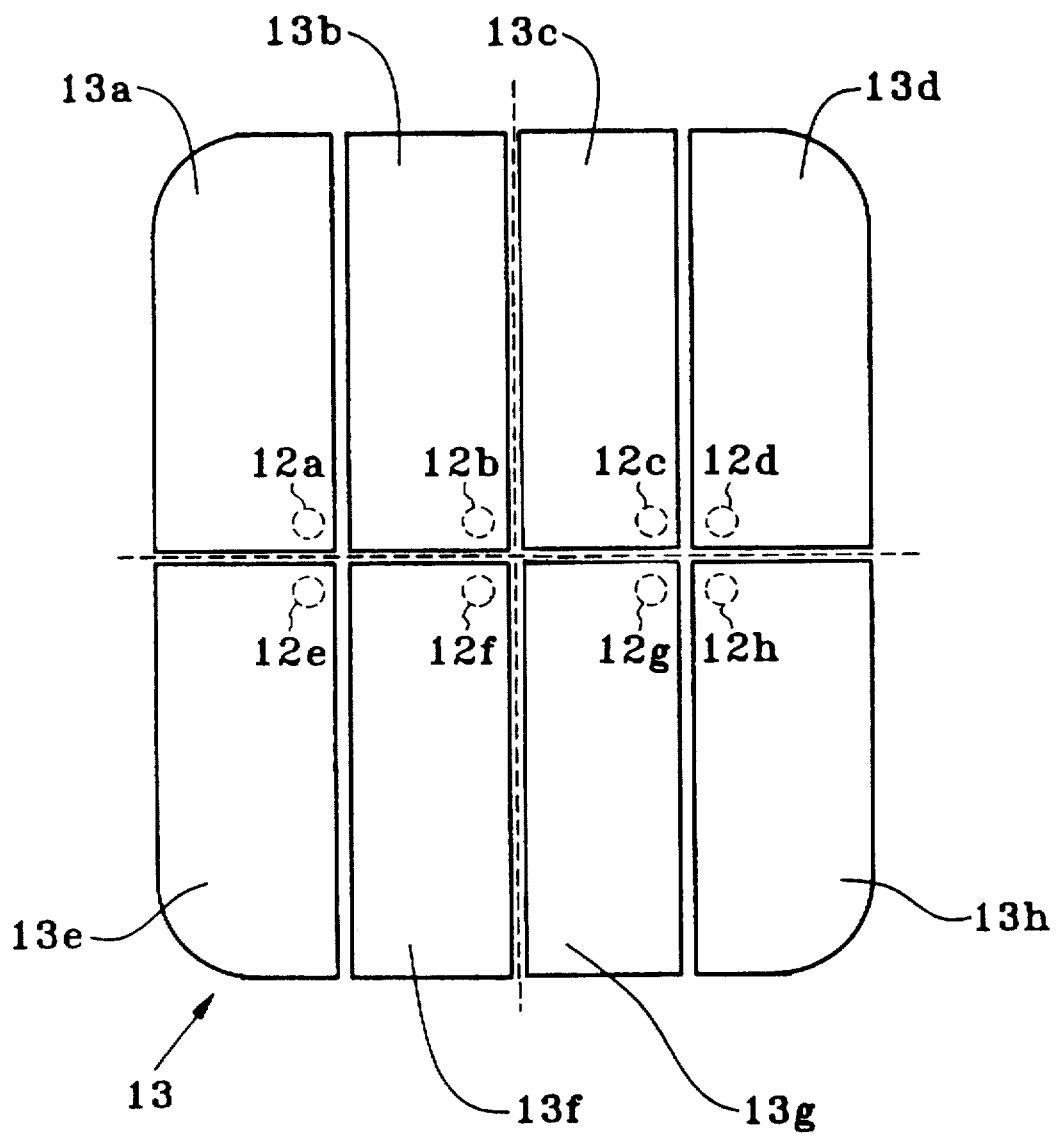
FIG. 3 is a plan view of an electrical contact shown in FIG. 2.

In FIG. 2, it can be seen that the first face of the sheet 10 of the substrate is designed to receive electrical contacts 13 for each electronic module, and as can be seen more clearly in FIG. 3, these contacts comprise a plurality, in this case eight, areas 13a to 13h each overlying a respective through hole 12a to 12h. Said electrical contacts 13 are made by a first silkscreening operation using a conductive ink, preferably a silver-filled conductive ink since that is the cheapest technique. During this operation, the through holes 12 are partially filled with conductive ink. Holes 12 could conceivably be completely filled in this step, but this is unlikely due to the viscosity of the ink and the small diameter of holes 12.

The electrical contacts 13 obtained in this way are designed to be suitable for coming into contact with standard connectors in electronic memory card readers. Contacts 13 are, therefore, common to various applications for modules. As a result, substrate sheets 10 can be silkscreened on their first faces on a large scale and can then be stored after heat treatment while waiting to receive a second silkscreening (described below) on their second faces specific to some given type of integrated circuit. The second silkscreening also serves to pour ink into holes 12 to insure that they are fully filled.

Unless the ink used is a gold-filled polymer or a gold/organometal-filled polymer, electrical contacts 13 silkscreened using a silver-filled polymer ink can be plated by metal deposition, e.g. using nickel and then gold, with this being done for reasons of appearance and/or compatibility with the nature of the projections on the flip chips. The technique used for plating the contacts 13 may be the so-called "electroless" ion displacement method.

The screens used for silkscreening are made from stainless steel with mesh size lying in the range 200 mesh to 400 mesh.

Figure 4:
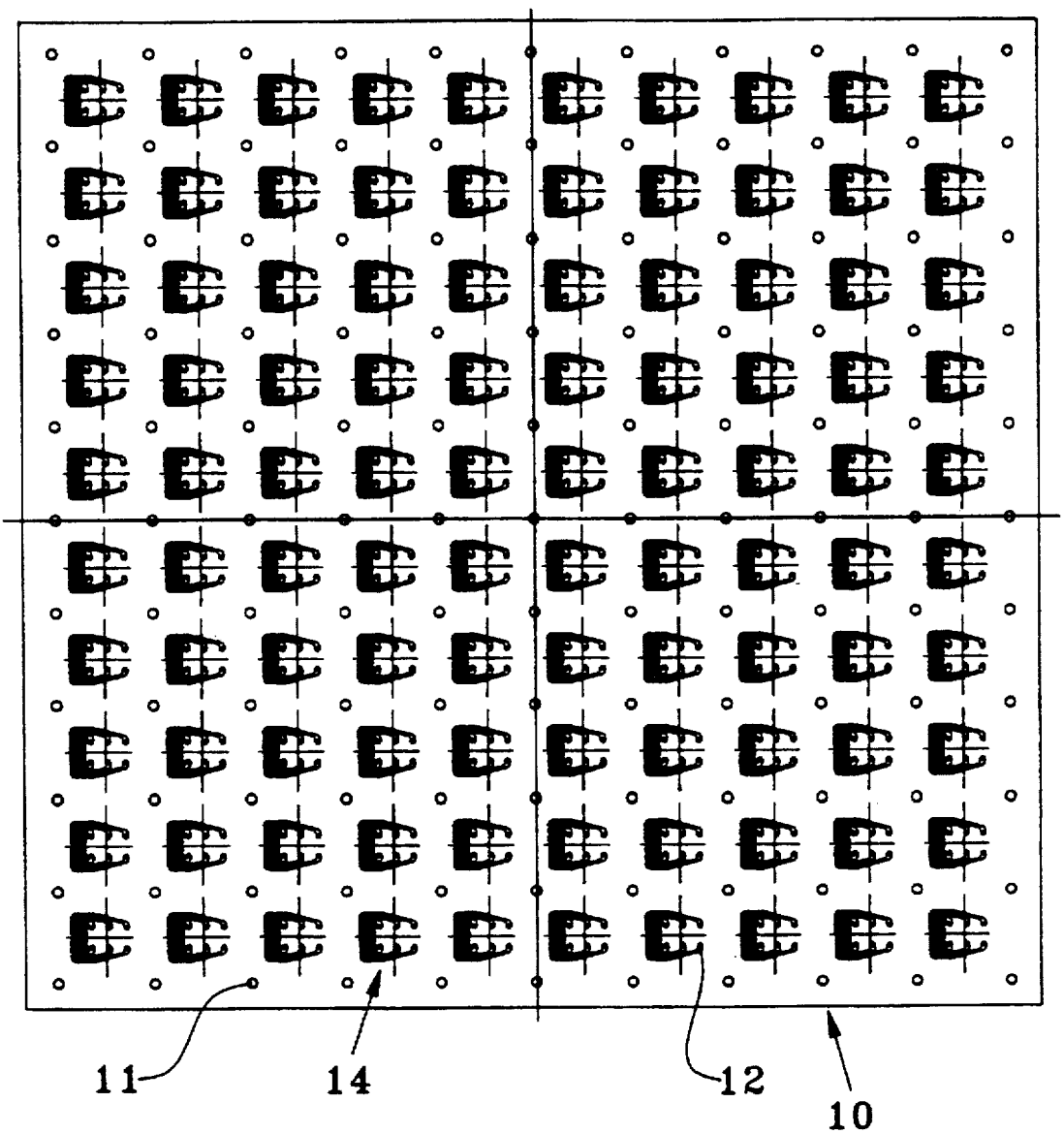
FIG. 4 is a plan view of the second face of the sheet shown in FIG. 1 after the interconnection patterns have been silkscreened.

FIG. 4 shows the second face of the insulating sheet 10 onto which interconnection patterns 14 have been printed in a second silkscreening step, these patterns serving to electrically interconnect the outlets of the through holes 12 in said second face with connection pads 15 (FIG. 5) disposed so as to engage the projections of the flip chips. This puts each projection into electrical connection with a single one of the electrical contact areas 13. It is clear that this type of interconnection is specific to a given integrated circuit.

Figure 5:
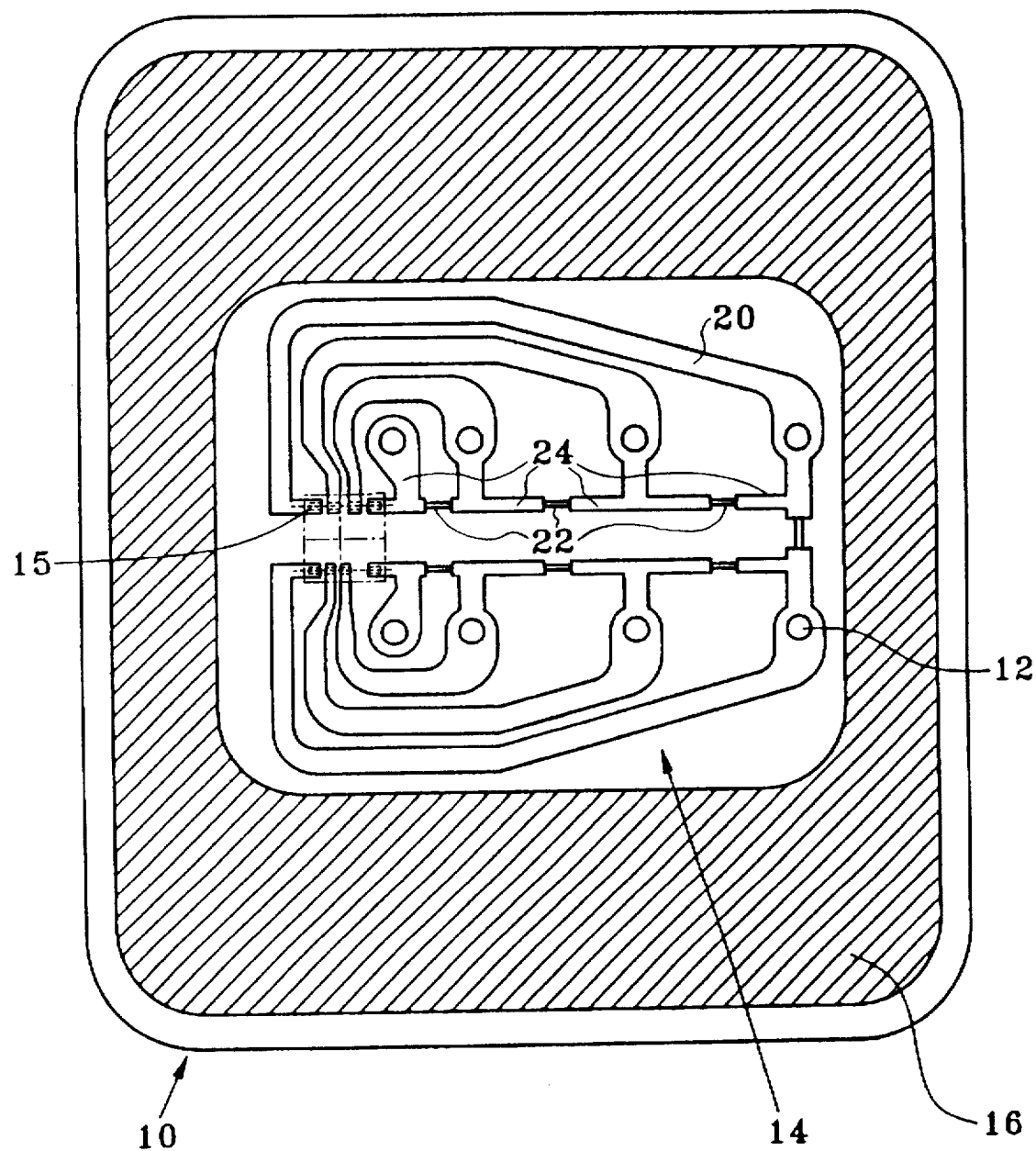
FIG. 5 is a plan view of one of the interconnection patterns shown in FIG. 4.

FIG. 5 shows leads 20 which connect through holes 12 to connection pads 15, respectively. Resistors 22 and leads 24 interconnect all holes 12 and pads 15 to each other. Resistors 22 have very high resistance values so as to, in effect, block current flow thereacross under normal working conditions of the circuitry. However, resistors 22 enable current flow under abnormal conditions, such as if excessive electrical charges appear in the circuitry.

It is also possible to print an assembly material on said second face by a silkscreening method, an adhesive method, or any other method, with the assembly material serving to secure the electronic modules into respective cavities formed in the bodies of electronic memory cards. Thus, as shown in FIG. 5, the assembly material 16 can be deposited in a ring around the interconnection patterns 14. The kind of material used may be a thermally reactivatable epoxy resin or a hot melt adhesive. It is also possible to print a thermoplastic, with the dimensions of the pattern being determined so as to define an energy concentrator (e.g., an ultrasonic lens, not shown) that is sufficient to enable the modules to be assembled in the card bodies by ultrasound.

If cards are manufactured by being molded around their respective electronic modules, then the material of the module substrate is preferably a thermoplastic suitable for promoting the creation of molecular bonds between the insulating substrate and the card body.

Figure 6A:
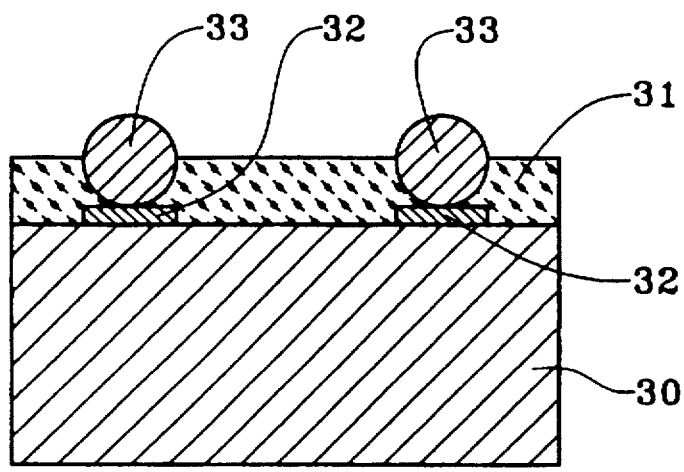
FIG. 6a is a side view of an integrated circuit having projections formed thereon.
Figure 6B:
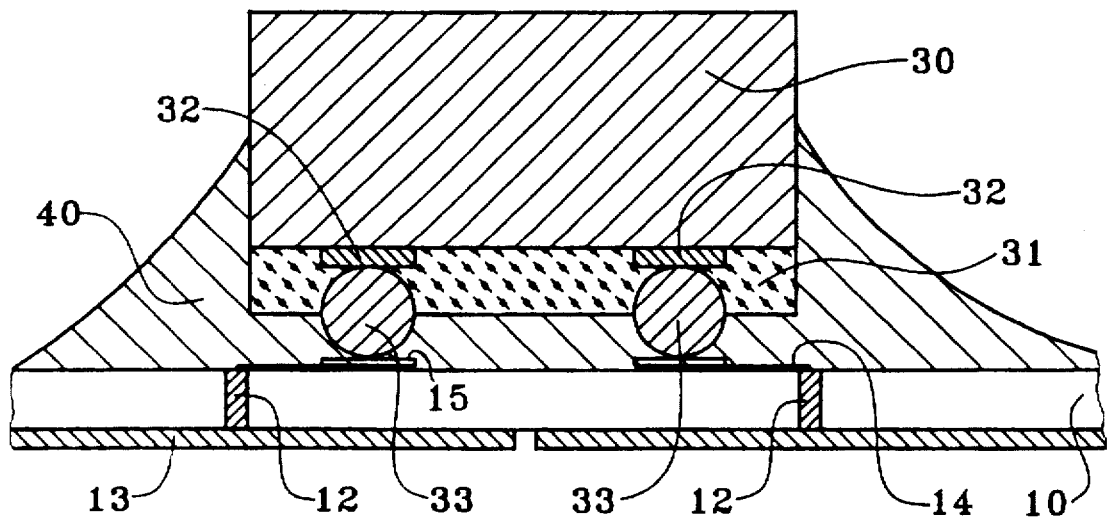
FIG. 6b is a side view of the integrated circuit shown in FIG. 6a, mounted on the interconnection second face of the insulating substrate of FIG. 4.

Finally, in a last step of the method of the invention, the flip chips are mounted on the connection pads 15 of respective interconnection patterns 14. For this purpose, the integrated circuits are prepared in a manner described below with reference to FIGS. 6a and 6b.

While integrated circuits 30 are still united on a wafer, a layer 31 of dielectric material is deposited by silkscreening while sparing input/output metallizations 32 and the paths (not shown) for cutting up the wafer into individual integrated circuits. Thereafter, the projections 33 are silkscreened through a metal mask whose openings correspond to the metallizations 32 on the circuits 30. This high accuracy mask is either machined by laser or else made by electrolytic growth.

The projections 33 are preferably made using electrically conductive polymers which, in the application to electronic memory cards, provide better mechanical decoupling between the integrated circuit and the card body. Such mechanical decoupling is typically made a part of the design of electronic memory cards because the card body must absorb flexion distortion without affecting the integrated circuit. Naturally, in order to be compatible with the method, the input/output metallizations 32 of the circuits must be made using a stainless metal or a metal whose oxide is a conductor of electricity: gold, titanium/tungsten, silver, copper.

Several variants can be envisaged depending on the nature of the conductive polymer forming the projections:

a) the polymer may be made of a silver-filled epoxy resin monomer which is polymerized after silkscreening, such as by heating or by exposure to UV light;

b) the polymer may be made of a reactivatable silver-filled epoxy resin monomer that is dried after silkscreening and that is polymerized after the integrated circuit has been assembled on the insulating substrate of the module; or c) the polymer may be made of a silver-filled thermoplastic.

At this stage of the method, the wafer is sliced into individual integrated circuits which are ready to be assembled to the substrate.

Each integrated circuit 30 which is provided with projections 33 is taken automatically from the sliced wafer and is then turned upside down so as to present its active face, i.e., with projections 33 on it, to the interconnection second face of the substrate 10 of the module. After the projections 33 have been brought into alignment with the connection pads 15, pressure is applied on the circuit 30 and the temperature in the zone of the module that is being assembled is raised. The method selected for forming the conductive polymer material of the projections depends on the above-described variants, as follows:

(i) In variant a), additional silkscreening is required on the interconnection second face of the substrate 10, but solely on its connection pads 15. This deposition of epoxy resin (not shown) that is identical to that of the projections 33 is performed using a screen that is specific to each type of integrated circuit, and is needed to ensure adhesion of projections 33 to connection pads 15. The heater device of the equipment is not activated, with the epoxy resin being polymerized after the circuit has been put into place.

(ii) In variant b), there is no additional operation. The heater device is activated so as to hold the integrated circuit in place, with complete polymerization of the epoxy resin also taking place subsequently.

(iii) In variant c), there is also no additional operation. The heater device is activated, and the zone of the substrate 10 corresponding to the module that is being assembled is raised to the temperature at which the thermoplastic begins to melt. Mechanical and electrical bonding takes place during cooling.

Another bonding method is ultrasonic welding.

After these assembly operations, a fluid resin 40 may be applied to each chip 30 so as to seal it.

Once the resin 40 has set, each module position on the sheet 10 of substrate is tested for function, with bad locations being identified in exactly the same manner as is used for integrated circuits that are still on their wafer.

When they are about to be integrated into card bodies, the modules are cut up into units, and faulty modules are discarded.

Although preferred embodiments of the invention have been described in detail above, various modifications thereto will be readily apparent to anyone with ordinary skill in the art. All such modifications are intended to fall within the scope of the present invention as defined by the following claims.

I claim:

1. A method of manufacturing a set of electronic modules for electronic memory cards, using integrated circuits having projections, the method comprising the steps of:

a) forming a plurality of groups of regularly spaced apart through holes in an insulating sheet substrate, each group of holes being associated with an electronic module, and said through holes being provided to receive a conductive material in order to provide electrical continuity between first and second faces of the insulating substrate, said faces being respectively provided to receive, for each electronic module, firstly electrical contacts for connection with an external connector, and secondly interconnection patterns onto which the integrated circuit having projections is to be mounted;

b) a first silkscreening operation for making said electrical contacts by depositing a conductive ink on the first face of the insulating sheet substrate, said holes being partially filled with said ink;

c) a second silkscreening operation for making said interconnection patterns by depositing a conductive ink on the second face of the sheet of substrate, said holes being filled up with said ink; and d) mounting integrated circuits having projections on the interconnection patterns on said second face of the insulating substrate.

2. A method according to claim 1, wherein said insulating sheet substrate is stored after the first silkscreening step b) and prior to the second silkscreening step c).

3. A method according to claim 1, wherein, between the second silkscreen step c) and the assembly step d) there is interposed a deposition step during which an assembly material for assembling the electronic modules in the bodies of electronic memory cards is deposited around said interconnection patterns.

4. A method according to claim 3, wherein said assembly material is a thermally reactivatable epoxy resin.

5. A method according to claim 3, wherein said assembly material is a hot melt adhesive.

6. A method according to claim 3, wherein said assembly material is a thermoplastic for ultrasonic welding.

7. A method according to claim 3, wherein said assembly material is a thermoplastic suitable for promoting the creation of molecular bonds between the insulating substrate and the card body when the electronic memory cards are made by molding.

8. A method according to claim 1, wherein said insulating sheet substrate is made of a thermoplastic material suitable for creating molecular bonds with the card body made of thermoplastic material when the electronic memory cards are molded.

9. A method according to claim 1, wherein said conductive ink is a silver-filled or a gold-filled or a gold/organometal-filled polymer ink.

10. A method according to claim 1, wherein said projections are made of conductive polymer.

* * * * *